United States Patent
Farmer

(10) Patent No.: US 10,360,882 B1
(45) Date of Patent: Jul. 23, 2019

(54) SEMI-TRANSPARENT INTERACTIVE AXIAL READING DEVICE

(71) Applicant: Terence Farmer, Ann Arbor, MI (US)

(72) Inventor: Terence Farmer, Ann Arbor, MI (US)

(*) Notice: Subject to any disclaimer, the term of this patent is extended or adjusted under 35 U.S.C. 154(b) by 0 days.

(21) Appl. No.: 15/604,063

(22) Filed: May 24, 2017

Related U.S. Application Data

(60) Provisional application No. 62/341,976, filed on May 26, 2016.

(51) Int. Cl.
| | |
|---|---|
| G10H 1/00 | (2006.01) |
| G10G 1/00 | (2006.01) |
| G10G 3/04 | (2006.01) |
| G02B 27/01 | (2006.01) |
| H01L 51/52 | (2006.01) |

(52) U.S. Cl.
CPC .................. *G10G 1/00* (2013.01); *G10G 3/04* (2013.01); *G02B 2027/0196* (2013.01); *H01L 51/5234* (2013.01)

(58) Field of Classification Search
CPC ............... G06F 3/04883; G06F 3/0488; G06F 3/04845; G06F 2203/04804; G06F 1/1626; G06F 3/0416; G06F 2203/04803; G06F 3/0412; G06F 1/1643; G06F 1/1616; G06F 3/14; G06F 1/1684; G06F 1/1694; G06F 17/24; G06F 3/1242; G06F 2203/041
See application file for complete search history.

(56) References Cited

U.S. PATENT DOCUMENTS

| | | | | |
|---|---|---|---|---|
| 6,226,909 | B1* | 5/2001 | Banning | G09F 7/12 40/564 |
| 2004/0049743 | A1* | 3/2004 | Bogward | G06F 1/162 715/262 |
| 2006/0183505 | A1* | 8/2006 | Willrich | G06F 1/1616 455/566 |
| 2007/0182663 | A1* | 8/2007 | Biech | G06F 1/1618 345/1.1 |
| 2008/0062625 | A1* | 3/2008 | Batio | G06F 1/1615 361/679.29 |
| 2010/0321275 | A1* | 12/2010 | Hinckley | G06F 1/1618 345/1.3 |

(Continued)

OTHER PUBLICATIONS

Neil Tanner, "How does a presidential teleprompter work?", Dec. 17, 2013.*

*Primary Examiner* — Marlon T Fletcher
(74) *Attorney, Agent, or Firm* — Sandy Lipkin

(57) ABSTRACT

A semi-transparent display screen that is foldable like a folio and that can be used to display sheet music or any other material to multiple users such that said displayed material is not visible from the non-user side. A projection of the readable material can be accomplished through a projection array and allows for changes to one device to sync to other devices it is in communication with. A specialized stylus can be used to instantly make annotations, without deleting or otherwise permanently editing or altering the publisher's original copy, and other controls to the device can be made through touch commands. The devices can communicate wirelessly, via radio or can be manually connected to external devices. The devices utilize rechargeable batteries. An integrated motion-sensing system along with group syncing will enable page turn and markup execution from one master device.

7 Claims, 4 Drawing Sheets

(56) References Cited

U.S. PATENT DOCUMENTS

| | | | | |
|---|---|---|---|---|
| 2012/0254773 | A1* | 10/2012 | Viswanathan | G06F 3/0483 715/753 |
| 2013/0077228 | A1* | 3/2013 | Batio | G06F 1/1641 361/679.29 |
| 2015/0024728 | A1* | 1/2015 | Jang | H04M 1/72519 455/418 |
| 2015/0355729 | A1* | 12/2015 | Park | G06F 3/1446 345/173 |
| 2015/0373480 | A1* | 12/2015 | Park | G06F 1/1652 715/748 |
| 2016/0026381 | A1* | 1/2016 | Kim | G06F 3/04817 715/761 |
| 2016/0179766 | A1* | 6/2016 | Kim | G06F 3/0482 715/206 |
| 2017/0132960 | A1* | 5/2017 | Kis-Benedek Pinero | G09F 21/04 |
| 2018/0039410 | A1* | 2/2018 | Kim | G06F 3/04817 |

* cited by examiner

SEMI-TRANSPARENT INTERACTIVE AXIAL READING DEVICE

REFERENCE TO PRIOR APPLICATION

This application claims priority of the provisional patent application 62/341,976, filed May 26, 2016 entitled SEMI-TRANSPARENT AXIAL INTERACTIVE READING DEVICE by Terence Ian Farmer.

BACKGROUND OF THE INVENTION

Field of the Invention

The field of this invention relates generally to the field of tablet computing devices, and more particularly toward a semi-transparent reading device with two display panels that are connected via a hinge that may be coupled to a projection system so that the two panels, in combination with the projection system function as a display device that is self-contained and can be supplied to multiple users simultaneously as desired containing identical content. The device is primarily inspired by the need for providing the advantages of dependable electronic display for performers to read music from during live performance of professional orchestras, but can be used in any situation where similar technology is desirable.

Description of the Prior Art

The inspiration for the instant invention was for the improvement of orchestra-conducting of live performances. However, the system may also be used also in a rehearsal setting in the case where an orchestra performs without a score. When conducting an orchestra or in rehearsal, typically each individual musician has in front of them a stand with paper sheet music. Copyrighted music is put onto paper and that paper is then placed on each individual music stand for each musician. As the music is played and as each end of each written page is reached, each individual musician is required to stop what they are during and turn the page and then continue on playing.

This can cause disruptions in the flow of music. While individual musicians have years of practice in doing this, there is still improvements that can be made with the technology of the instant invention. The instant invention seeks to provide a system and device that allows for the music (or other readable or viewable material) to be electronically placed onto a computing tablet-like device that is flat and semi-transparent and can fold like a folio or standard book. The invention seeks to eliminate the need for manual page-turning, it provides an easy way to make changes to a score and have those changes submitted to individual devices that are synchronized to those changes.

The invention also provides a means to protect the copyright of the written material by preventing photocopying of paper print-outs of sheet music as well as unlawful retaining of electronic content.

SUMMARY OF THE INVENTION

The basic embodiment of the present invention teaches a semi-transparent interactive reading device comprising: a first flat screen display device having a front side and a back side said first flat screen further comprising: a CPU; wireless communication capacity; a projection system; a motion tracking system; a rechargeable battery; a port bay for connection to external devices; and a touch screen control panel; wherein readable, editable, interactive content is displayed on said front side and is not viewable from said back side; a second flat screen display device having a front side and a back side said second flat screen further comprising: a CPU; wireless communication capacity; a projection system; a motion tracking system; a rechargeable battery; a port bay for connection to external devices; and a touch screen control panel; wherein readable, editable, interactive content is displayed on said front side and is not viewable from said back side; and a hinge connecting said first flat screen with said second flat screen wherein a folio-configuration that is foldable is formed.

The above embodiment can be further modified by defining that said projection for said first and second flat screen display devices is a detachable projection module.

The above embodiment can be further modified by defining that a specialized stylus is used to annotate or edit content displayed on said first and second flat screen display devices.

The above embodiment can be further modified by defining that said back side of said first flat screen display device and said back side of said second flat screen device when connected through said hinge and in an open, folio position, houses a removable stand further comprising: a first vertical leg with a top side and a bottom side; a second vertical leg with a top side and a bottom side wherein said first and second vertical legs are substantially parallel with each other; a horizontal base bar connected to said bottom side of said first vertical and said bottom side of said second vertical leg; a first hinge attached to said top side of said first vertical leg; a second hinge attached to said top side of said second vertical leg; wherein when said first and second vertical legs are moved outward from said back sides of said first and second flat screen devices through the movement said first and second hinges, said horizontal base bar is extended outward from said back side of first and second flat screen display devices thereby providing a stand so that said front side is displayed at a readable angle.

The above embodiment can be further modified by defining that said content on said first and second flat screen display devices can be manually manipulated with said motion tracking systems and said stylus.

The above embodiment can be further modified by defining that multiple devices can communicate with each other through said wireless communication capacity.

The above embodiment can be further modified by defining that said device can load or unload content to an external device through connection to said port bay.

BRIEF DESCRIPTION OF THE DRAWINGS

For a better understanding of the present invention, reference is to be made to the accompanying drawings. It is to be understood that the present invention is not limited to the precise arrangement shown in the drawings.

DETAILED DESCRIPTION OF A PREFERRED EMBODIMENT

Figure 1:
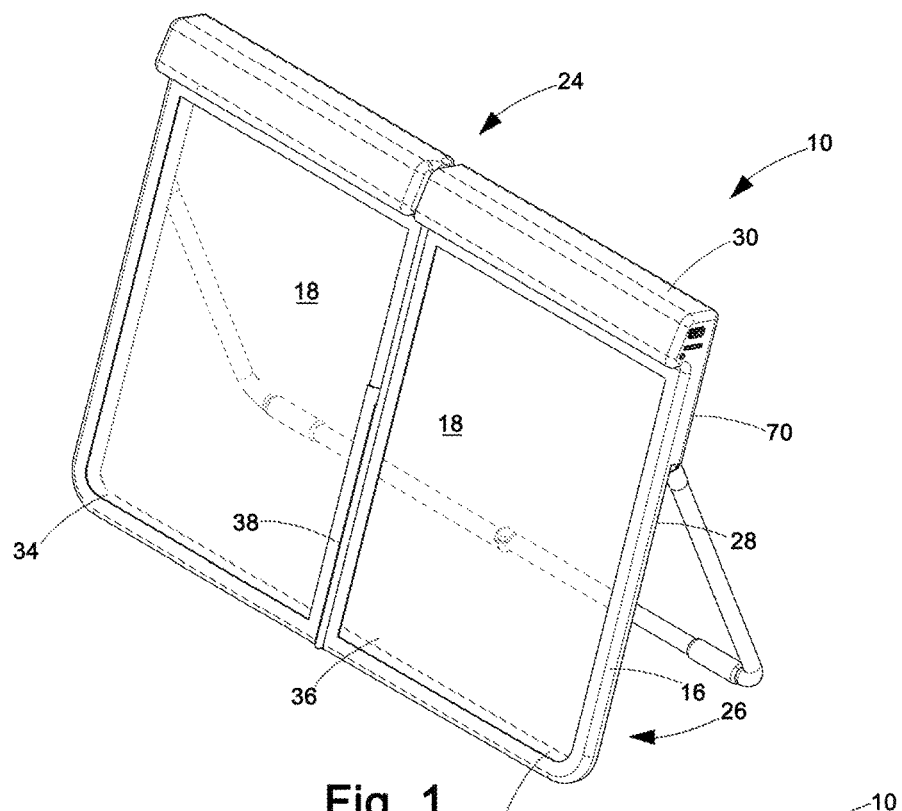
FIG. 1 is a top perspective view of the electronic computing/reading device of the instant invention.
Figure 2:
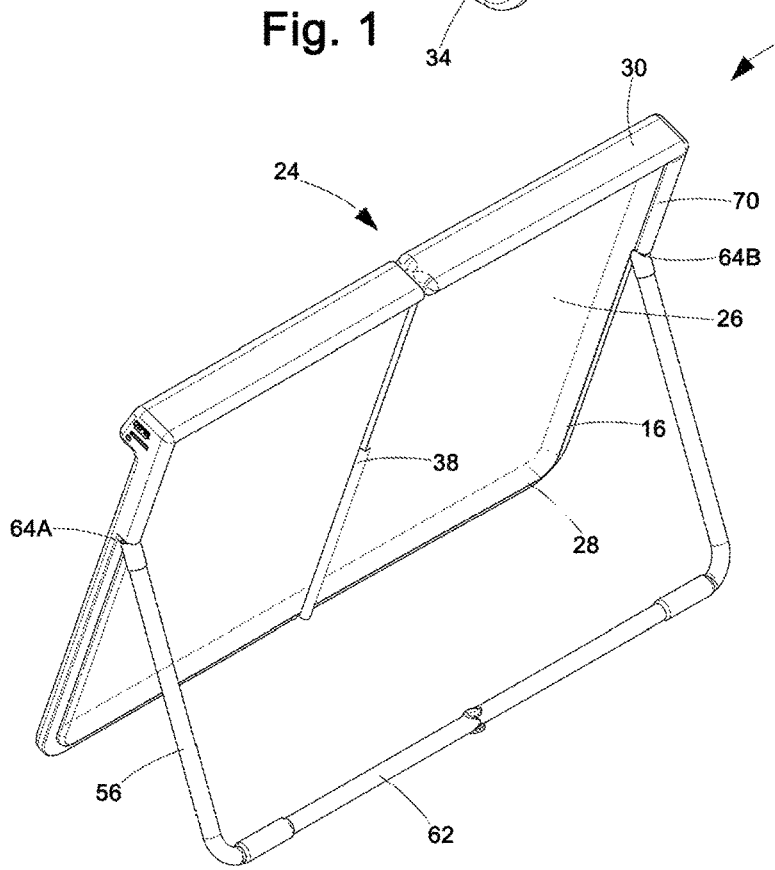
FIG. 2 is a rear top perspective view of the electronic computing/reading device of the instant invention.

Turning to the drawings, the preferred embodiment is illustrated and described by reference characters that denote similar elements throughout the several views of the instant invention.

The instant invention discloses a projection system or other display function that acts like a teleprompter device with sheet music or other readable or viewable material that is held as a pdf image of a publisher's original. The device is self-contained, requiring no separate portable computer. The device is functionally providing a display for said pdf material. The device is a flat, tablet-like computing device that can fold in half like a folio that mimics sheet music or a standard book. It is transparent from the audience's point of view, but the musicians in an orchestra (or in any other type of setting that has a similar need) can see a functionally displayed image on their side in any light level circumstance. The transparent side may alternatively, as a synchronized unit, display across the orchestra a tiled display of any image of the enterprise's choosing, such as video to enhance performance, advertising, titling, and the like.

One person, such as the leader of a string section can make changes demanded by the conductor to the sheet music program as desired without it having to be made by each individual musician or reader on their sheet music or other material. The changes will all be synchronized to each device in the section. Furthermore, when the end of a screen/page is reached, the musicians will no longer have to stop what they are doing, removing their hands from their instruments, and turning the page.

Annotations made over the top of the original image and saved with the original document are controlled with a proprietary stylus controlled by a single person, i.e., the string section leader and no page-turning is needed. Furthermore, the removal of paper sheet music further protects the copyrighted material found therein in that it cannot be retained or duplicated so that electronic piracy is also eliminated. The material is electronic and can be accessed through a subscription or a fee so that the copyright holder can be properly compensated without the work being stolen.

The computing device is a lightweight, thin, optionally foldable tablet-like device 10 that employs a composite of extant technologies. It includes a processing unit 12 and a projection system 14A that are positioned around the perimeter 16 of a two-way mirror-like display panel 18 made from polycarbonate or similar unbreakable material. It is designed with an operating system that makes use of a wireless radio 20 to communicate with external devices 22. It is intended to provide a projected interactive smart display for pdf images, though as with any portable electronic device technology, can also potentially be used to display documents, web-pages, and the like. This image is projected onto a folio-sized display panel 18. The device 10 possesses an onboard CPU 12 and various other electronic components that are required to enable the device to function in much the same way as a mobile computing device.

The device 10 is designed to weigh less than comparably sized tablet computers currently on the market. Additionally, the simplistic approach to utilization of micro form factor components entirely mounted at the top 24 of a durable display board is anticipated to provide a higher durability and reliability factor than a comparably sized tablet computer. The use of a projection-based concept technology enables the form factor for the display panel 18 portion, to be foldable and eventually offered at custom display sizing options, with very little difference in tooling cost to modify. A use of the present invention will be to replace traditional notebooks of all kinds, not just sheet music, which was the inspiration for the entire concept.

The drawings show various views of the simple visual design of the invention. The device 10 is a gesture-controlled display device used to render images that are not visible from the rear side 26 of the device 10. It includes a frame 28, a projection array unit 30, a motion tracking system 32, a two-way display panel 18, a system on a chip 52 (SOC), a stylus 54 and a rechargeable battery 34. It is an object of the instant invention to provide a device 10 that functions similarly to a standard tablet computer that differs in that it makes use of the projection or other LED array unit 30 and the two-way display panel 18 to create a device 10 with a screen that is sufficiently transparent to anyone but the user of the device, i.e., the front side 36 has the projected image facing the user while the rear side 26 is transparent to those viewing from the rear, such as to an audience in a live orchestra performance. To accomplish this, the projection or other LED array unit 30 projects images onto the transparent two-way display panel 18.

The entire SOC may be a port snap-in detented/clip integrated into top molding, so in the event of device failure, in a few moments the entire file and control system can be removed and inserted into any other available identically designed functioning spare device.

The semi-frameless device is an ergonomically-designed rigid structure to which the projection array unit 30, the motion tracking system 32 and two panel 18 display are connected. The device includes a hinge 38 connecting the two display panels 18 allowing for folding as desired and also includes a control panel 40. The hinge 38 enables two or more units 10 to be connected so that it is foldable, folio-style. The device 10 can stand alone in the folded position or remain folded open such that the devices function as a single unit, folio-style. As a result, two units 10 can be connected by the hinge 38 and fold in a similar manner as a book. The control panel 40 is a connection of tactile buttons 42 that are integrated into the housing. Basic control of the display is achieved with on-screen controls. It has a non-technical interface for any level of user so that minimal computer familiarity is required to effect use of the device. An on-screen menu 40 enables a user to control functions of the device 10, such as power, default user levels for volume, brightness and the like. Optionally, a camera, a microphone and speakers can be incorporated into the frame 28 for embodiments that are intended for other than the performance of live music. The frame 28 is designed with an external device port bay 46 that can be used to connect it to external devices and power supplies. As a result, the device 10 can be connected to computer or external drives, SD ports, etc. so that files may be transferred directly onto the SOC 52. An optional port can also be included where removable storage media can be connected.

In one embodiment, the projection array unit 30 is a projector that uses multiple projection modules to generate detailed images on one surface of the front side 36 of the two-way display panel 18. The projection array unit 30 comprises at least one projection module and at least one module socket. The projection array unit 30 features an image projection module that is detachably connected to a single module socket. Consequently, a user is able to replace defective image projection modules at will. The at least one image projection module is a laser projection display chip. Optionally, the at least one image projection modules are diode projection devices. The motion tracking system 32 is a camera that monitors the movement of devices placed onto or near the two-way display panel 18. As a result, the device 10 is able to interpret the gestures made by a user as primarily for instantaneous page-turn commands. The motion tracking system 32 can use electromagnetic sensing technology to detect changes in an electric field surrounding the device 10 caused by a user's hand gestures, such as the conductor in the orchestra example. The motion tracking system 32 interprets these changes in electric fields as commands.

The two way display panel 18 is a transparent panel that functions as the screen onto which the projection array unit 30 casts images. The two way display panel 18 is coated with a material that prevents glare. The two way display panel 18 can also be designed with a touch-sensitive layer. In this embodiment, a user is able to interact with the devices by physically touching the two way display panel 18. The SOC 52 is mounted within the frame 28 and functions as a central processing unit of the device. The SOC 52 is electronically connected to the display device 18, the motion tracking system 32 and the projection array unit 30. Additionally, the SOC 52 is manufactured with a proprietary bandwidth wireless radio 20 that enables the unit to connect to other identified devices. Additionally standard 803.11 wi-fi will enable the device to separately connect and communicate over wireless data transfer networks. The stylus 54 functions similarly to a standard stylus and enables a user to write and interact with information displayed on the two way display panel 18. The rechargeable battery 34 is mounted within the housing and is electronically connected to the electrical components of the device.

Figure 3A:
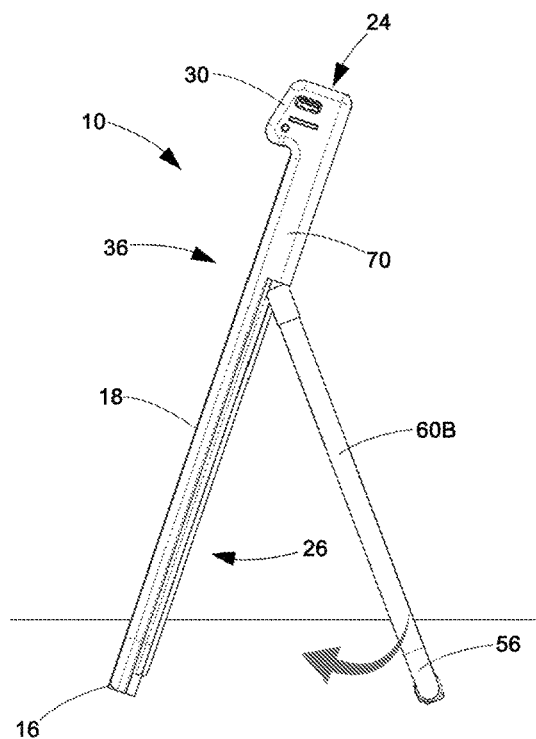
FIG. 3A is a side view of the electronic computing/reading device of the instant invention in the open position.
Figure 3B:
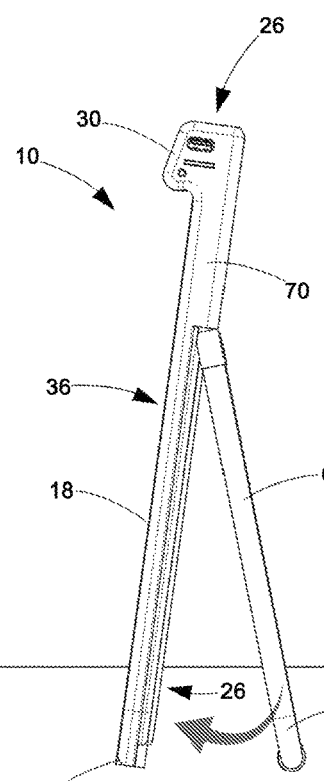
FIG. 3B is a side view of the electronic computer/reading device of the instant invention in the partially closed position.
Figure 3C:
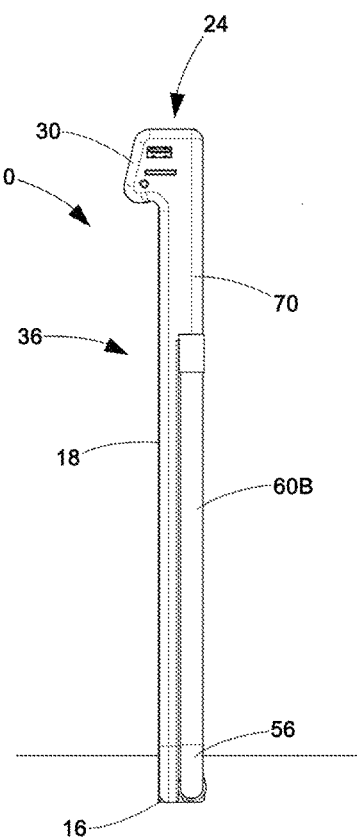
FIG. 3C is a side view of the electronic computer/reading device of the instant invention in the closed position.
Figure 4:
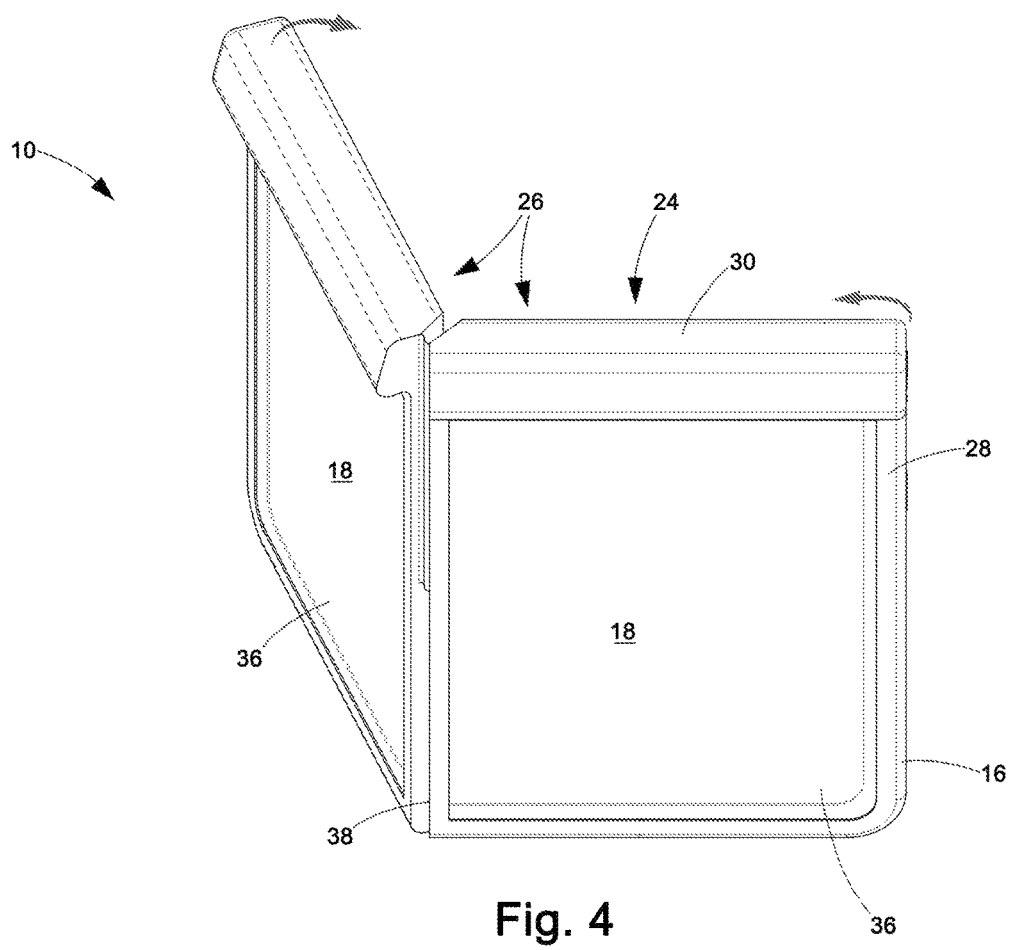
FIG. 4 is a perspective view of the electronic computing/reading device of the instant invention prior to folding the two panels together.
Figure 5:
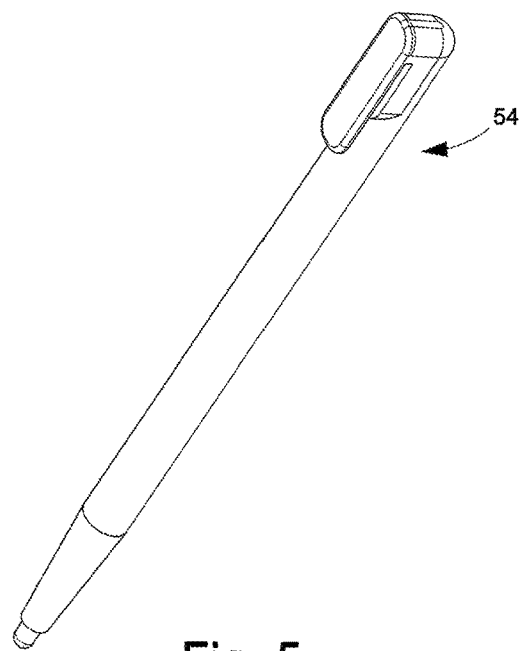
FIG. 5 is perspective view of the stylus of the electronic computing/reading device of the instant invention.
Figure 6:
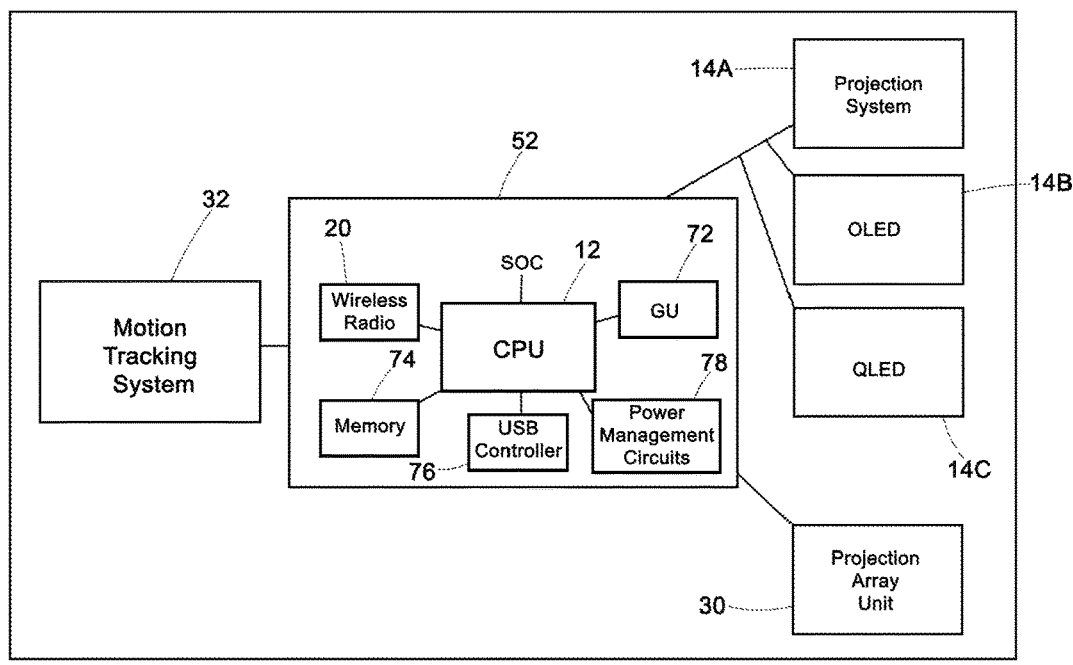
FIG. 6 is a schematic representation of the internal electronic workings of the electronic computing/reading device of the instant invention.
Figure 7:
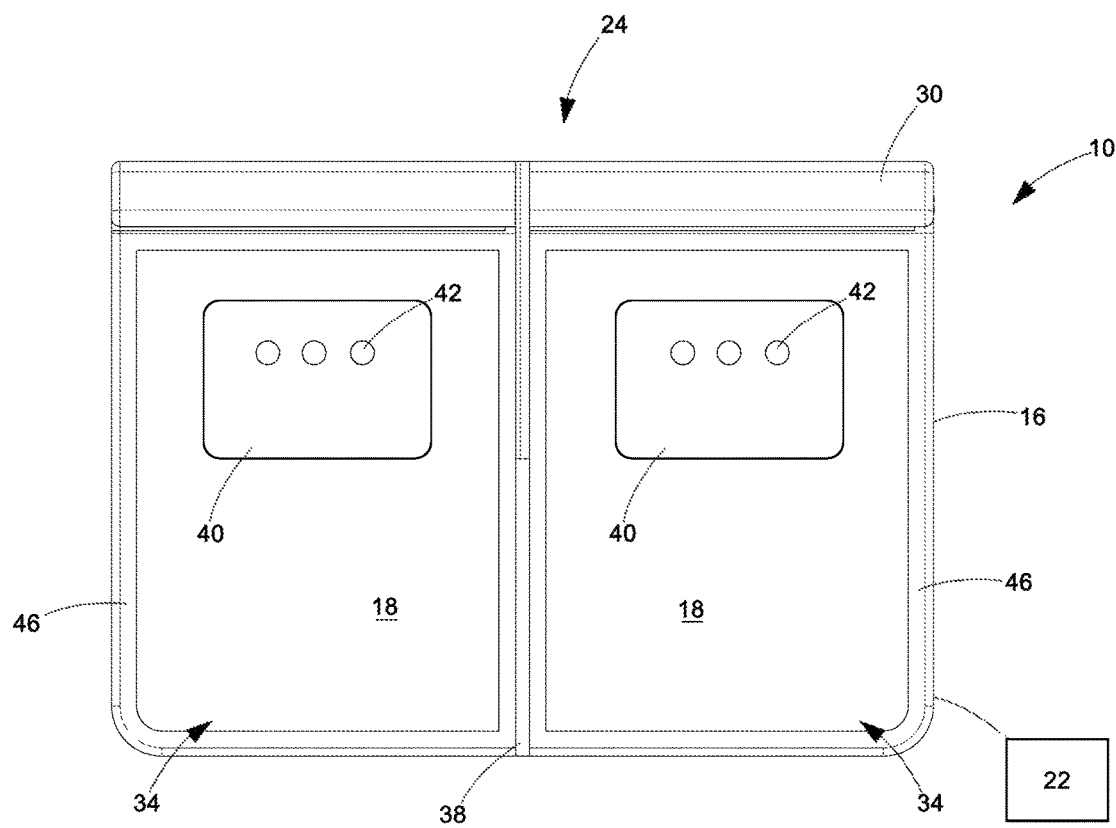
FIG. 7 is a flat schematic view of the control panel of the electronic computing/reading device of the instant invention.

The device 10 can also stand alone through an integral stand 56 that is an integrated frame module comprised of the kickstand 56 and upper frame molding 70 (See FIGS. 3-5). The stand 56 rests flush against the rear side 26 of the device 10 along the perimeter 16 and set in therefrom. The stand 56 has two vertical arms 60A, 60B and a horizontal arm 62 that allows for the device 10 to rest against when the stand 56 is moved away from the device 10 through the movement of the hinges 64A, 64B that terminate at the bottom of the upper frame molding 70 which is positioned between the top of the device 10 and about the halfway point down the height of the device 10.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

What is claimed is:

1. A self-contained, semi-transparent interactive reading device comprising:
 a first flat screen display device having a front side and a back side wherein content on said front side is viewable to a reader while said back side is transparent from a back view such as when viewed by an audience wherein when viewing from said back side, contents on said front side are not visible, said first flat screen further comprising:
  a CPU embedded in said device;
  wireless communication capacity;
  a projection system in communication with said CPU and embedded in said device such as to project content as dictated by said CPU onto said first flat screen;
  a motion tracking system;
  a rechargeable battery;
  a port bay for connection to external devices; and
  a touch screen control panel;
 wherein readable, editable, interactive content is displayed on said front side and is not viewable from said back side, said back side being transparent when viewed from said back side and wherein said content is displayed using said projection system in communication with said CPU, both embedded in said device to project said content onto said front side of said first flat screen while said back side remains transparent;
 a second flat screen display device having a front side and a back side wherein content on said front side is viewable to a reader while said back side is transparent from a back view such as when viewed by an audience, said second flat screen further comprising:
  a CPU embedded in said device;
  wireless communication capacity;
  a projection system in communication with said CPU and embedded in said device such as to project content as dictated by said CPU onto said second flat screen;
  a motion tracking system;
  a rechargeable battery;
  a port bay for connection to external devices; and
  a touch screen control panel;

wherein readable, editable, interactive content is displayed on said front side and is not viewable from said back side, said back side being transparent when viewed from said back side and wherein said content is displayed using said projection system in communication with said CPU, both embedded in said device to project said content onto said front side of said second flat screen while said back side remains transparent; and a hinge connecting said first flat screen with said second flat screen wherein a folio-configuration that is foldable is formed wherein said first flat screen and said second flat screen comprising a single, inseparable computing device.

2. The semi-transparent interactive reading device as defined in claim 1 wherein said projection for said first and second flat screen display devices is a detachable projection module.

3. The semi-transparent interactive reading device as defined in claim 1 wherein a specialized stylus is used to annotate or edit content displayed on said first and second flat screen display devices.

4. The semi-transparent interactive reading device as defined in claim 1 wherein said back side of said first flat screen display device and said back side of said second flat screen device when connected through said hinge and in an open, folio position, houses a collapsible stand further comprising:

a first vertical leg with a top side and a bottom side;

a second vertical leg with a top side and a bottom side wherein said first and second vertical legs are substantially parallel with each other;

a hinged horizontal base bar connected to said bottom side of said first vertical and said bottom side of said second vertical leg;

a first hinge attached to said top side of said first vertical leg;

a second hinge attached to said top side of said second vertical leg;

wherein when said first and second vertical legs are moved outward from said back sides of said first and second flat screen devices through the movement said first and second hinges, said horizontal base bar is extended outward from said back side of first and second flat screen display devices thereby providing a stand so that said front side is displayed at a readable angle.

5. The semi-transparent interactive reading device as defined in claim 3 wherein said content on said first and second flat screen display devices can be manually manipulated with said motion tracking systems and said stylus.

6. The semi-transparent interactive reading device as defined in claim 1 wherein multiple devices can communicate with each other through said wireless communication capacity.

7. The semi-transparent interactive reading device as defined in claim 1 wherein said device can load or unload content to an external device through connection to said port bay.

* * * * *